(12) United States Patent
Yosui

(10) Patent No.: US 10,188,000 B2
(45) Date of Patent: Jan. 22, 2019

(54) COMPONENT MOUNTING BOARD

(71) Applicant: Murata Manufacturing Co., Ltd., Nagaokakyo-shi, Kyoto-fu (JP)

(72) Inventor: Kuniaki Yosui, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/055,207

(22) Filed: Aug. 6, 2018

(65) Prior Publication Data

US 2018/0343747 A1 Nov. 29, 2018

Related U.S. Application Data

(63) Continuation of application No. PCT/JP2017/011576, filed on Mar. 23, 2017.

(30) Foreign Application Priority Data

Mar. 25, 2016 (JP) .................. 2016-061220

(51) Int. Cl.
*H05K 3/32* (2006.01)
*H05K 3/34* (2006.01)
(Continued)

(52) U.S. Cl.
CPC .............. *H05K 3/34* (2013.01); *H05K 1/141* (2013.01); *H05K 1/18* (2013.01); *H05K 3/28* (2013.01);
(Continued)

(58) Field of Classification Search
CPC ......... H05K 3/361; H05K 3/323; H05K 1/141
(Continued)

(56) References Cited

U.S. PATENT DOCUMENTS 6,972,966 B1 * 12/2005 Oishi .................. H05K 1/141
174/250
7,019,221 B1 3/2006 Noda
(Continued)

FOREIGN PATENT DOCUMENTS

JP 06-73391 A 9/1994
JP 2000-165007 A 6/2000
(Continued)

OTHER PUBLICATIONS

Official Communication issued in International Patent Application No. PCT/JP2017/011576, dated Jun. 20, 2017.

*Primary Examiner* — Sherman Ng
(74) *Attorney, Agent, or Firm* — Keating & Bennett, LLP

(57) ABSTRACT

An insulating board includes a first portion that is relatively thick and a second portion that is relatively thin. The first and second portions have different thicknesses so that a step is provided therebetween. The insulating board includes a first land conductor on a first mounting surface of the first portion at a side at which the step is provided, a second land conductor on a second mounting surface of the second portion at the side at which the step is provided, and an insulating protection film on the first mounting surface so that a portion of the first land conductor is exposed and another portion of the first land conductor is covered. An electronic component is soldered to the first land conductor. Another electronic component is joined to the second land conductor by an anisotropic conductive film that covers the second land conductor.

12 Claims, 8 Drawing Sheets

(51) Int. Cl.
    *H05K 1/18*     (2006.01)
    *H05K 3/28*     (2006.01)
    *H05K 1/14*     (2006.01)
    *H05K 3/36*     (2006.01)

(52) U.S. Cl.
    CPC ............ *H05K 3/323* (2013.01); *H05K 3/361* (2013.01); *H05K 2201/0129* (2013.01)

(58) Field of Classification Search
    USPC .......................... 174/254, 260; 361/749, 760
    See application file for complete search history.

(56) References Cited

U.S. PATENT DOCUMENTS

2002/0131253 A1    9/2002    Kobayashi
2015/0358517 A1*  12/2015  Ikemoto ............ H01L 27/14618
                                                      29/832

FOREIGN PATENT DOCUMENTS

JP        2001-156418 A     6/2001
JP        2002-280702 A     9/2002
JP        2015-211106 A    11/2015

\* cited by examiner

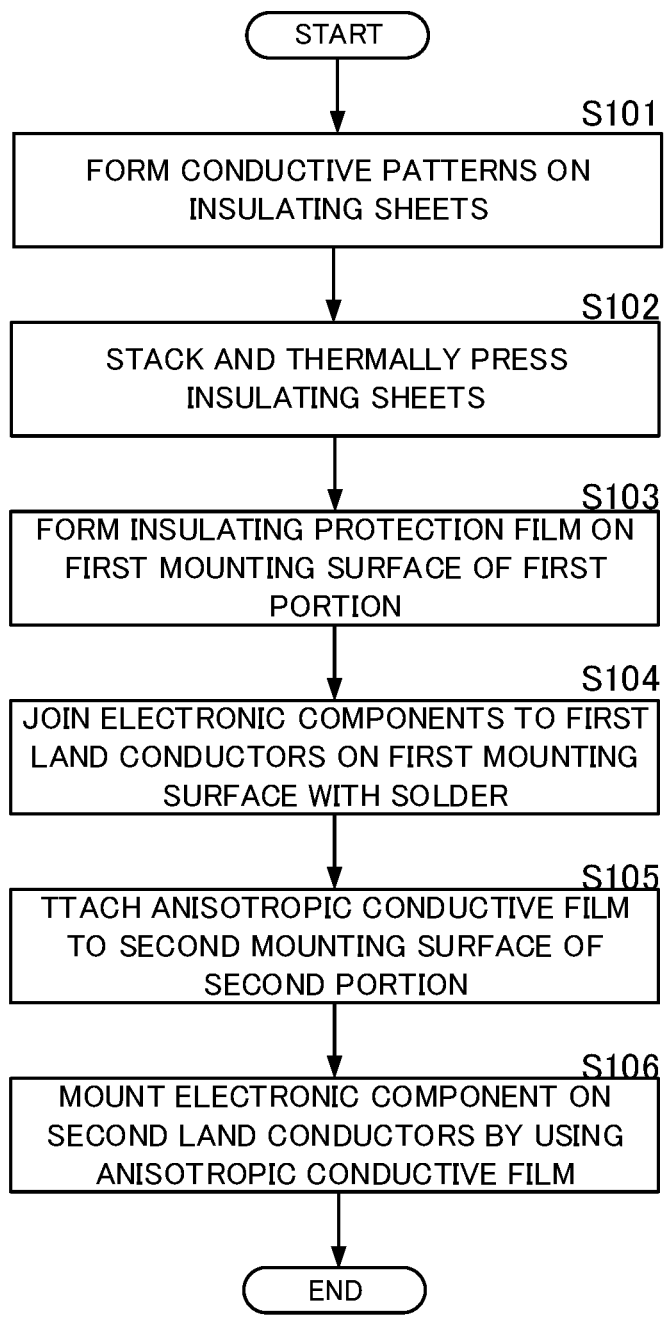

COMPONENT MOUNTING BOARD

CROSS REFERENCE TO RELATED APPLICATIONS

This application claims the benefit of priority to Japanese Patent Application No. 2016-061220 filed on Mar. 25, 2016 and is a Continuation Application of PCT Application No. PCT/JP2017/011576 filed on Mar. 23, 2017. The entire contents of each application are hereby incorporated herein by reference.

BACKGROUND OF THE INVENTION

1. Field of the Invention

The present invention relates to a component mounting board including a circuit board and components mounted on the circuit board.

2. Description of the Related Art

Examples of existing electronic devices include electronic components for performing the functions of the electronic devices. The electronic components are mounted on a circuit board. The circuit board includes an insulating resin board and a conductive pattern formed on the resin board. A plurality of mounting land conductors and the conductive pattern are formed on a mounting surface of the circuit board.

The electronic components are generally soldered to the land conductors.

Such a circuit board includes an insulating protection film formed thereon for protecting the exposed conductive pattern, as described in Japanese Examined Patent Application Publication No. 6-73391. The insulating protection film includes openings at portions (central portions) of the land conductors on the mounting surface, and covers the conductive pattern over a region excluding the portions of the land conductors.

However, when the mounting surface of the circuit board has a step, there is a risk that the protection film cannot be accurately positioned. In such a case, the openings in the protection film may not be arranged at accurate positions with respect to the land conductors. Accordingly, there is a risk that the electronic components cannot be successfully mounted or reliably joined to the land conductors. There is also a risk that the land conductors cannot be covered with the protection film at the ends thereof and will be removed.

SUMMARY OF THE INVENTION

Preferred embodiments of the present invention provide protection to conductive patterns provided on mounting surfaces of circuit boards and enable electronic components to be joined to land conductors on the mounting surfaces with increased reliability even when the mounting surfaces include a step.

A component mounting board according to a preferred embodiment of the present invention includes an insulating board, a first electronic component, and a second electronic component. The first and second electronic components are mounted on the insulating board. The insulating board includes a first portion that is relatively thick and a second portion that is relatively thin, the first portion and the second portion having different thicknesses so that a step is provided therebetween. The insulating board also includes a first land conductor provided on a first mounting surface of the first portion at a side at which the step is provided; a second land conductor provided on a second mounting surface of the second portion at the side at which the step is provided; and an insulating protection film provided on the first mounting surface so that a portion of the first land conductor is exposed and another portion of the first land conductor is covered by the insulating protection film. The first electronic component is soldered to the first land conductor. The second electronic component is joined to the second land conductor by an anisotropic conductive film that covers the second land conductor.

With this structure, the second land conductor on which an insulating protection film cannot be disposed is able to be protected by the anisotropic conductive film over the entire area thereof.

In a component mounting board according to a preferred embodiment of the present invention, the second portion may be flexible.

In such a structure, the anisotropic conductive film is provided on the second portion that is flexible. Accordingly, the flexible portion is able to be joined with high reliability.

In a component mounting board according to a preferred embodiment of the present invention, the insulating board preferably includes a plurality of insulating sheets that are laminated together in a thickness direction, each insulating sheet being made of a thermoplastic resin.

With such a structure, when the insulating board is defined by a multilayer body including the plurality of insulating sheets, no additional material is interposed between the insulating sheets, and the risk of separation between the layers of the multilayer body is reduced.

In a component mounting board according to a preferred embodiment of the present invention, the second portion may be surrounded by the first portion.

In such a structure, an insulating protection film cannot be easily provided on the second portion. Accordingly, the anisotropic conductive film is more effective.

In a component mounting board according to a preferred embodiment of the present invention, preferably, the insulating board further includes a third portion that is thinner than the first portion, and the component mounting board further includes a third electronic component that is mounted on the third portion. Also, preferably, the third portion is thicker than the second portion.

In such a structure, the anisotropic conductive film is provided on the insulating board in the region in which it is most difficult to position the insulating protection film. Accordingly, the advantages of the anisotropic conductive film over solder are more significant.

In a component mounting board according to a preferred embodiment of the present invention, an object may be disposed in the first portion of the insulating board, the object having a hardness greater than a hardness of the insulating board.

With such a structure, deformation of the insulating board in the soldering process is reduced.

According to preferred embodiments of the present invention, even when a mounting surface of a component mounting board includes a step, a conductive pattern provided on the mounting surface is able to be protected, and electronic components are able to be joined to land conductors on the mounting surface with increased reliability.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 3 is a flowchart of a method for manufacturing the component mounting board according to the first preferred embodiment of the present invention.

DETAILED DESCRIPTION OF THE PREFERRED EMBODIMENTS

Figure 1:
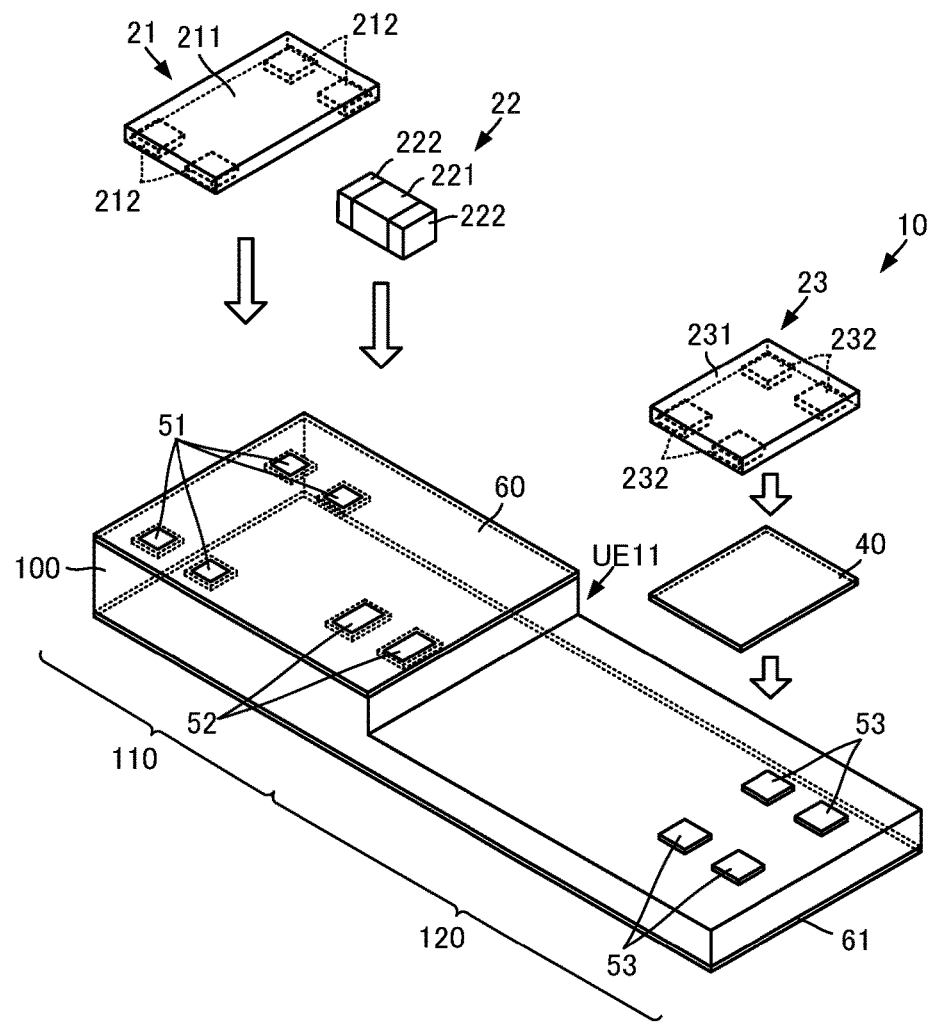
FIG. 1 is an exploded perspective view of a component mounting board according to a first preferred embodiment of the present invention.
Figure 2:
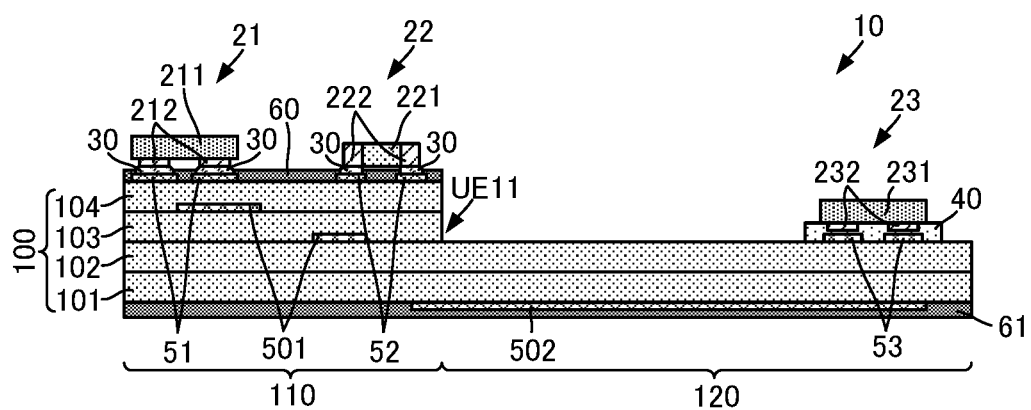
FIG. 2 is a side sectional view illustrating the structure of the component mounting board according to the first preferred embodiment of the present invention.

Component mounting boards according to preferred embodiments of the present invention will be described with reference to the drawings. FIG. 1 is an exploded perspective view of a component mounting board 10 according to a first preferred embodiment of the present invention. FIG. 2 is a side sectional view illustrating the structure of the component mounting board 10 according to the first preferred embodiment of the present invention.

As illustrated in FIGS. 1 and 2, the component mounting board 10 includes an insulating board 100 and electronic components 21, 22, 23. Each of the electronic components 21 and 22 corresponds to a "first electronic component", and the electronic component 23 corresponds to a "second electronic component". As illustrated in FIG. 2, the insulating board 100 is a multilayer body including a plurality of insulating sheets 101, 102, 103, and 104 that are laminated together. The insulating sheets 101, 102, 103, and 104 are preferably made of a thermoplastic resin. For example, the main material of the insulating sheets 101, 102, 103, and 104 may preferably be a liquid crystal polymer.

The insulating sheets 101 and 102 are flat films having the same or substantially the same area, and the insulating sheets 103 and 104 are flat films having the same or substantially the same area. The area of the insulating sheets 103 and 104 is smaller than the area of the insulating sheets 101 and 102.

End surfaces of the insulating sheets 101, 102, 103, and 104 at one end thereof are flush or substantially flush with each other. Accordingly, the insulating board 100 includes a first portion 110 that is relatively thick and a second portion 120 that is relatively thin. In other words, the first portion 110 and the second portion 120 are integral with each other.

Since the first portion 110 and the second portion 120 have different thicknesses, the insulating board 100 includes a step UE11.

A conductive pattern 501 is provided inside the insulating board 100. A conductive pattern 502 is provided on a surface of the insulating board 100 at the side at which the step UE11 is not provided. The surface of the insulating board 100 at the side at which the step UE11 is not provided includes an insulating protection film 61 provided thereon over the entire or substantially the entire area thereof so as to cover the conductive pattern 502.

A surface of the first portion 110 at the side at which the step UE11 is provided is a first mounting surface. The electronic components 21 and 22 are mounted on the first mounting surface.

More specifically, the following configuration is provided. The electronic component 21 includes a main body 211 and a plurality of mounting terminals 212. The mounting terminals 212 are provided on a back surface of the main body 211. The electronic component 22 includes a main body 221 and a plurality of mounting terminals 222. The mounting terminals 222 are provided at both ends of the main body 221. The mounting terminals 222 are provided so as to extend from both end surfaces of the main body 221 to a back surface of the main body 221.

A plurality of first land conductors 51 and 52 are provided on the first mounting surface of the first portion 110. An insulating protection film 60 is also provided on the first mounting surface of the first portion 110. The insulating protection film 60 includes holes (protection-film-free regions) so that a portion of each of the first land conductors 51 and 52 is exposed at a corresponding one of the holes. The insulating protection film 60 extends over the entire or substantially the entire area of the first mounting surface except for the holes.

The mounting terminals 212 of the electronic component 21 are joined to the first land conductors 51 by solder 30. In other words, the exposed portions of the first land conductors 51 are covered by the solder 30, and are joined to the mounting terminals 212 by the solder 30.

The mounting terminals 222 of the electronic component 22 are joined to the first land conductors 52 by the solder 30. In other words, the exposed portions of the first land conductors 52 are covered by the solder 30, and are joined to the mounting terminals 222 by the solder 30.

In this structure, the mounting terminals 212 of the electronic component 21 and the mounting terminals 222 of the electronic component 22 are electrically and physically connected to the first land conductors 51 and 52, respectively, on the first portion 110. Since the solder 30 is used, the electronic components 21 and 22 is reliably joined to the first land conductors 51 and 52.

Since the conductors that are exposed at the first mounting surface are covered by the insulating protection film 60 or the solder 30, environment resistance is increased, and reliability is increased accordingly. In addition, end portions of the first land conductors 51 and 52 that are not joined to the solder 30 are covered by the insulating protection film 60. Therefore, the risk of removal of the first land conductors 51 and 52 is reduced, so that reliability is further increased.

The first portion 110 is thicker than the second portion 120, and is therefore, less easily deformed than the second portion 120. Accordingly, even when ultrasonic bonding is performed to join the mounting terminals 212 and 222 to the first land conductors 51 and 52 with the solder 30, deformation of the first portion 110 is small, and joining failure does not easily or readily occur. Thus, joining reliability is increased.

A surface of the second portion 120 at the side at which the step UE11 is provided is a second mounting surface. The electronic component 23 is mounted on the second mounting surface.

More specifically, the following configuration is provided. The electronic component 23 includes a main body 231 and a plurality of mounting terminals 232. The mounting terminals 232 are provided on a back surface of the main body 231.

The mounting terminals 232 of the electronic component 23 are joined to the second land conductors 53 by an anisotropic conductive film 40. The anisotropic conductive film 40 covers the second land conductors 53 over the entire or substantially the entire areas thereof.

If, for example, an insulating protection film is provided on the second mounting surface by applying resin paste to the second mounting surface by screen printing, it is difficult to accurately position the insulating protection film on the second portion 120, which is recessed due to the step UE11. Similarly, if an insulating protection film including a cover lay film is provided on the second mounting surface by attaching the cover lay film, it is difficult to accurately attach the cover lay film because of the step UE11.

In contrast, according to the structure of the present preferred embodiment, even when it is difficult to position an insulating protection film on the second mounting surface of the second portion 120 because the second portion 120 is recessed due to the step UE11, the second land conductors 53 are able to be protected from the external environment by the anisotropic conductive film 40, and reliability is increased accordingly. In addition, end portions of the second land conductors 53 are covered by the anisotropic conductive film 40. Therefore, the risk of removal of the second land conductors 53 is reduced, so that reliability is further increased.

It may also be difficult to attach the anisotropic conductive film 40 due to the recess. However, it is not necessary to provide holes corresponding to the second land conductors 53 in the anisotropic conductive film 40, and the anisotropic conductive film 40 may simply be disposed so as to cover the second land conductors 53. Therefore, compared to the above-described insulating protection film including a cover lay film, the anisotropic conductive film 40 is more reliably and easily provided.

The second portion 120 is thinner and more flexible than the first portion 110, and is therefore easily deformed. However, since the anisotropic conductive film 40 is deformed together with the second portion 120, the risk of joining failure due to deformation of the second portion 120 is reduced. Although the second mounting surface may be uneven since the second portion 120 is flexible, the anisotropic conductive film 40 is deformed in accordance with an increase in flatness due to deformation of the second mounting surface. Accordingly, joining reliability of the mounting terminals 232 and the second land conductors 53 is increased.

As illustrated in FIGS. 1 and 2, preferably, no conductive pattern other than the second land conductors 53 is provided on the second mounting surface of the second portion 120. In such a case, the environment resistance is further increased.

By using the structure of the component mounting board 10, even when a mounting surface includes a step, a conductive pattern provided on the mounting surface is able to be protected, and electronic components are able to be joined to land conductors on the mounting surface with increased reliability.

The component mounting board 10 having the above-described structure may be manufactured by a non-limiting example of a method described below. FIG. 3 is a flowchart of a method for manufacturing the component mounting board according to the first preferred embodiment of the present invention. FIGS. 4A to 4E are side sectional views of the component mounting board according to the first preferred embodiment of the present invention in respective manufacturing steps.

Figure 4A:
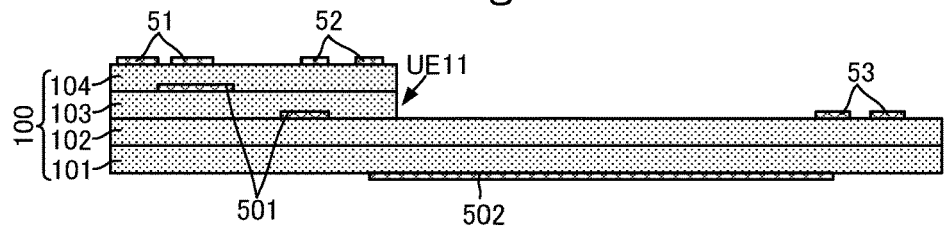
FIGS. 4A to 4E are side sectional views of the component mounting board according to the first preferred embodiment of the present invention in respective manufacturing steps.

First, different types of conductive patterns including land conductors are formed on the insulating sheets 101, 102, 103, and 104 (S101). More specifically, as illustrated in FIG. 4A, the conductive pattern 502 is formed on the insulating sheet 101, and the conductive pattern 501 is formed on the insulating sheets 102 and 103. In addition, the second land conductors 53 are formed on the insulating sheet 102, and the first land conductors 51 and 52 are formed on the insulating sheet 104. The conductive patterns are preferably made of, for example, metal foil, such as copper foil, and are formed by, for example, photolithography.

Next, as illustrated in FIG. 4A, the insulating sheets 101, 102, 103, and 104 are stacked together and thermally pressed (S102).

Figure 4B:
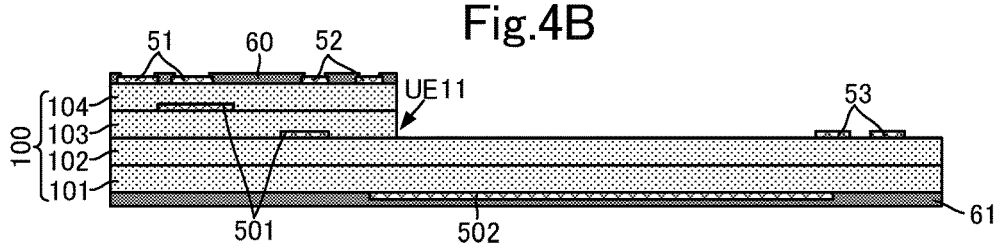

Next, as illustrated in FIG. 4B, the insulating protection film 60 is formed on the first mounting surface (surface at the side at which the step UE11 is provided) of the first portion 110 (portion thicker than the second portion 120) of the insulating board 100 (S103). The insulating protection film 60 is formed so that portions (central portions) of the first land conductors 51 and 52 are exposed. At this time, the insulating protection film 61 is formed on a surface of the insulating board 100 at the side at which the step UE11 is not provided. The insulating protection films 60 and 61 are preferably formed by, for example, applying epoxy-resin-based paste by screen printing.

Figure 4C:
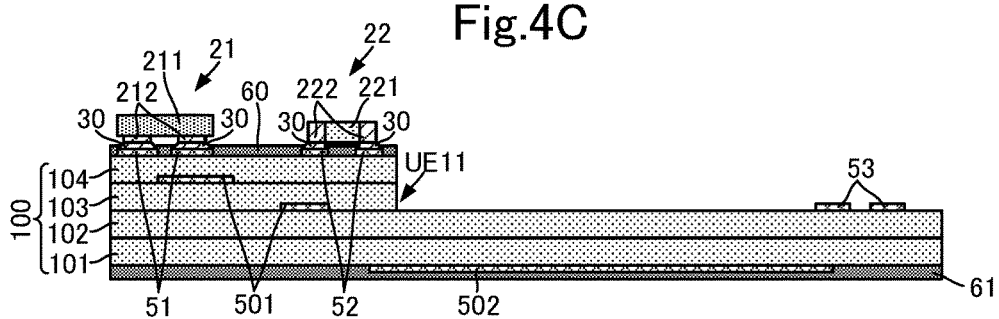

As illustrated in FIG. 4C, the mounting terminals 212 of the electronic component 21 are joined to the first land conductors 51 on the first mounting surface by the solder 30, and the mounting terminals 222 of the electronic component 22 are joined to the first land conductors 52 by the solder 30 (S104). This step is performed by, for example, a surface mount technology, such as reflowing, for soldering an electronic component on a surface of a board.

Figure 4D:
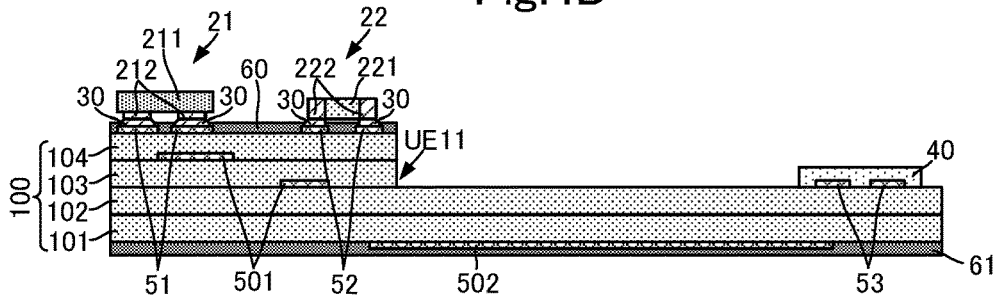

As illustrated in FIG. 4D, the anisotropic conductive film 40 is attached to the second mounting surface of the second portion 120 (S105). The anisotropic conductive film 40 is attached so as to cover the second land conductors 53 over the entire or substantially the entire areas thereof.

Figure 4E:
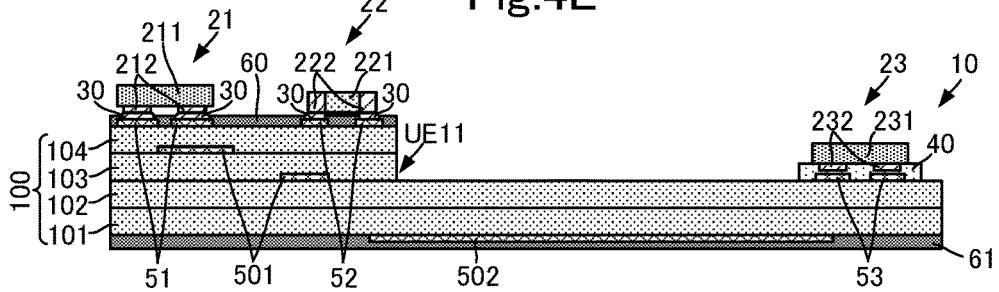

As illustrated in FIG. 4E, the electronic component 23 is disposed on the anisotropic conductive film 40, and the mounting terminals 232 of the electronic component 23 are mounted on the second land conductors 53 with the anisotropic conductive film 40 interposed therebetween by applying pressure with appropriately applying heat (S106).

The joining process using the anisotropic conductive film 40 may be performed before the reflow process, but is preferably performed after the reflow process. In such a case, deformation of both of the anisotropic conductive film 40 and the second portion 120 does not occur in the reflow process, and joining failure due to the deformation is prevented. Even when the second portion 120 is deformed in the reflow process, since the anisotropic conductive film 40 is used, the risk of joining failure on the second portion 120 due to the deformation is reduced.

Figure 5:
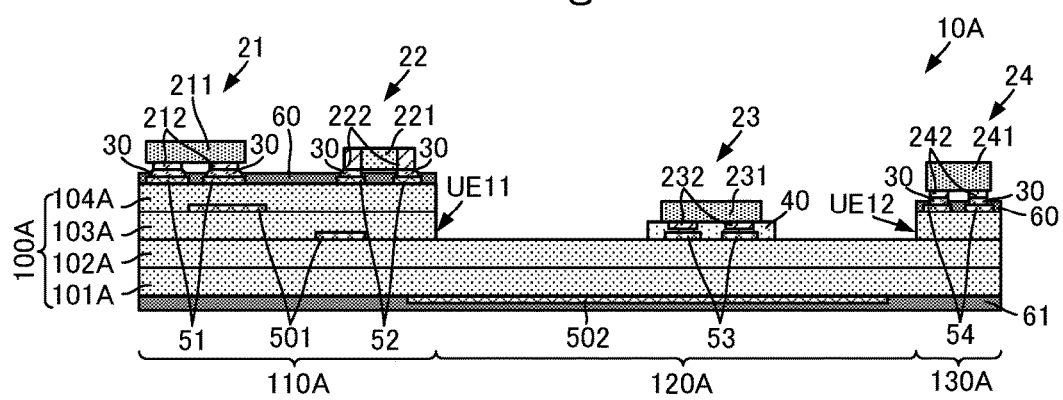
FIG. 5 is a side sectional view illustrating the structure of a component mounting board according to a second preferred embodiment of the present invention.

Next, a component mounting board according to a second preferred embodiment of the present invention will be described with reference to the drawings. FIG. 5 is a side sectional view illustrating the structure of a component mounting board 10A according to the second preferred embodiment of the present invention.

The component mounting board 10A according to the present preferred embodiment differs from the component mounting board 10 according to the first preferred embodiment in that a third portion 130A is additionally provided. Other portions of the component mounting board 10A are the same or substantially the same as those of the component mounting board 10 according to the first preferred embodiment, and description of the same or similar elements and features will be omitted.

An insulating board 100A includes a first portion 110A, a second portion 120A, and a third portion 130A. The first portion 110A, the second portion 120A, and the third portion 130A are integral with each other. The first portion 110A is the same or substantially the same as the first portion 110 according to the first preferred embodiment, and the second portion 120A is the same or substantially the same as the second portion 120 according to the first preferred embodiment.

The third portion 130A is connected to the second portion 120A at an end opposite to the end at which the second portion 120A is connected to the first portion 110A. Thus, the second portion 120A is disposed between the first portion 110A and the third portion 130A. The third portion 130A has a three-layer structure including insulating sheets 101A, 102A, and 103A. Therefore, preferably, the third portion 130A is thinner than the first portion 110A, and is thicker than the second portion 120A. Accordingly, a step UE12 is provided at a connecting portion between the second portion 120A and the third portion 130A.

A plurality of third land conductors 54 are provided on a third mounting surface of the third portion 130A at the side at which the step UE12 is provided. An insulating protection film 60 is provided on the third mounting surface. The insulating protection film 60 includes holes so that a portion (central portion) of each of the third land conductors 54 is externally exposed at a corresponding one of the holes. The insulating protection film 60 extends over the entire or substantially the entire area of the third mounting surface.

An electronic component 24 includes a main body 241 and a plurality of mounting terminals 242. The mounting terminals 242 are provided on a back surface of the main body 241. The electronic component 24 corresponds to a "third electronic component".

The mounting terminals 242 are joined to the third land conductors 54 by the solder 30.

In the case in which the second portion 120A is disposed between the first portion 110A and the third portion 130A, which are thicker than the second portion 120A, it is difficult to provide the insulating protection film 60 on the mounting surface of the second portion 120A. However, since the anisotropic conductive film 40 is provided on the second portion 120A, even when the insulating protection film 60 is not provided, the mounting terminals 232 is able to be joined to the second land conductors 53 with increased reliability, and the environment resistance is increased.

Figure 6:
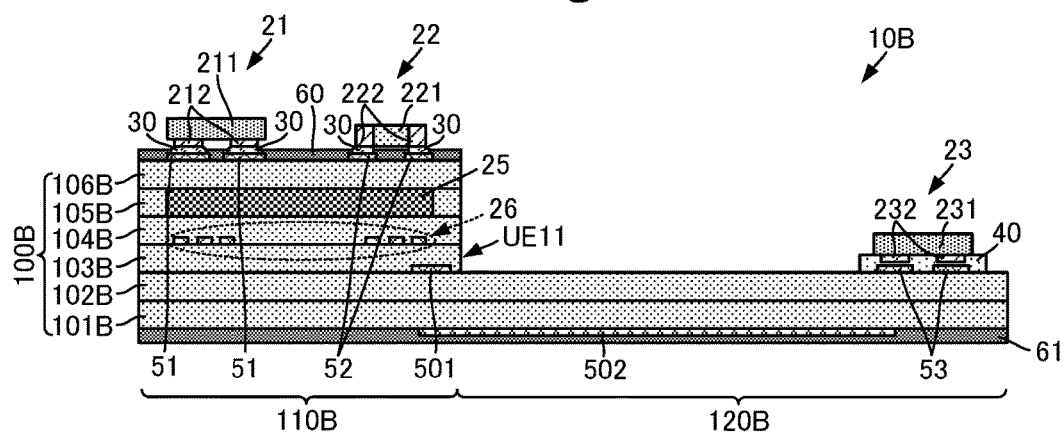
FIG. 6 is a side sectional view illustrating the structure of a component mounting board according to a third preferred embodiment of the present invention.

Next, a component mounting board according to a third preferred embodiment of the present invention will be described with reference to the drawings. FIG. 6 is a side sectional view illustrating the structure of a component mounting board 10B according to the third preferred embodiment of the present invention.

The component mounting board 10B according to the present preferred embodiment includes a first portion 110B having a structure that is different from that in the component mounting board 10 according to the first preferred embodiment. Other structures of the component mounting board 10B are the same or substantially the same as those of the component mounting board 10 according to the first preferred embodiment, and description of the same or similar elements and features will be omitted.

The first portion 110B of the insulating board 100B is defined by a multilayer body including a plurality of insulating sheets 101B, 102B, 103B, 104B, 105B, and 106B. A second portion 120B is defined by a multilayer body including the insulating sheets 101B and 102B.

An object 25 is mounted in the first portion 110B. More specifically, the insulating sheet 105B includes a through hole, and the object 25 is disposed in the through hole. The object 25 may or may not have a function for an electronic circuit as long as the hardness thereof is greater than that of the insulating board 100B. In this example, the object 25 is preferably a flat plate-shaped magnetic body, for example. The object 25 may instead be, for example, an IC chip, a passive chip component, or a thermosetting resin board. The object 25 is large enough to cover the first land conductors 51 and 52 over the entire or substantially the entire areas thereof in plan view of the first portion 110B.

Thus, the hardness of the first portion 110B is increased without changing the flexibility of the second portion 120B. Accordingly, deformation of the first portion 110B during ultrasonic bonding using the solder 30 is reduced, so that the risk of joining failure is reduced when the mounting terminals 212 and 222 are joined to the land conductors 51 and 52. Thus, joining reliability is increased.

A coil conductor 26 is also mounted in the first portion 110B. The coil conductor 26 is preferably a winding conductive pattern, for example. The coil conductor 26 overlaps the object 25 in plan view of the first portion 110B. With this structure, a coil is able to be mounted in the component mounting board 10B. Specifically, joining reliability is increased as described above, and a coil is able to be mounted in the component mounting board 10B.

The object 25 is preferably closer to the first mounting surface than the center of the first portion 110B in the thickness direction. In particular, the object 25 is preferably provided in an insulating sheet that is included only in the first portion 110B and that is not included in the second portion 120B. In such a case, deformation is more effectively reduced, so that the risk of joining failure is further reduced. Thus, joining reliability is further increased.

Figure 7:
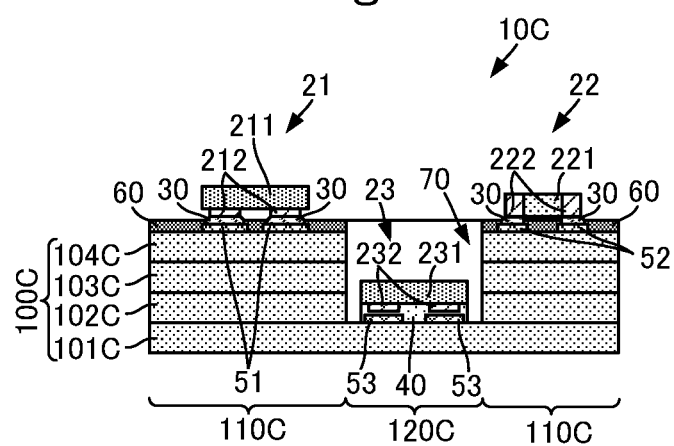
FIG. 7 is a side sectional view illustrating the structure of a component mounting board according to a fourth preferred embodiment of the present invention.

Next, a component mounting board according to a fourth preferred embodiment of the present invention will be described with reference to the drawings. FIG. 7 is a side sectional view illustrating the structure of a component mounting board 10C according to the fourth preferred embodiment of the present invention.

The component mounting board 10C according to the present preferred embodiment differs from the component mounting board 10 according to the first preferred embodiment in that the component mounting board 10C includes a second portion 120C that has a small area and that is surrounded by a first portion 110C in plan view of the component mounting board 10C.

The mounting structure of the electronic components 21 and 22 on the first portion 110C is the same or substantially the same as that on the first portion 110 according to the first preferred embodiment. More specifically, the electronic components 21 and 22 are mounted on the first land conductors 51 and 52 on the first portion 110C by the solder 30.

An insulating board 100C is defined by a multilayer body including a plurality of insulating sheets 101C, 102C, 103C, and 104C. The first portion 110C includes the insulating sheets 101C, 102C, 103C, and 104C, and the second portion 120C is includes only of the insulating sheet 101C.

The mounting structure of the electronic component 23 on the second portion 120C is the same or substantially the same as that on the second portion 120 according to the first preferred embodiment. More specifically, the electronic component 23 is mounted on the second land conductors 53 on the second portion 120C by the anisotropic conductive film 40.

In the component mounting board 10C, the second portion 120C is surrounded by the first portion 110C, and the area of the second portion 120C in plan view is about as small as the area of the electronic component 23 in plan view. The first portion 110C is thicker than the second portion 120C, and therefore, the component mounting board 10C includes a recess 70 in the region corresponding to the second portion 120C. The recess 70, which is a space above the second mounting surface, is surrounded by the first portion 110C. Therefore, it is not easy to form the insulating protection film 60 on the second mounting surface so that holes for the second land conductors 53 are accurately provided in the insulating protection film 60. However, the mounting terminals 232 of the electronic component 23 is able to be joined to the second land conductors 53 with reduced risk of removal of the second land conductors 53 and increased environment resistance by attaching the anisotropic conductive film 40 to the second mounting surface.

In the present preferred embodiment, the second portion 120C is surrounded by the first portion 110C. However, the mounting structures of the electronic components according to the present preferred embodiment may also be used when the first portion 110C includes a plurality of portions that are independent of each other and when the second portion 120C is disposed between these portions.

Figure 8:
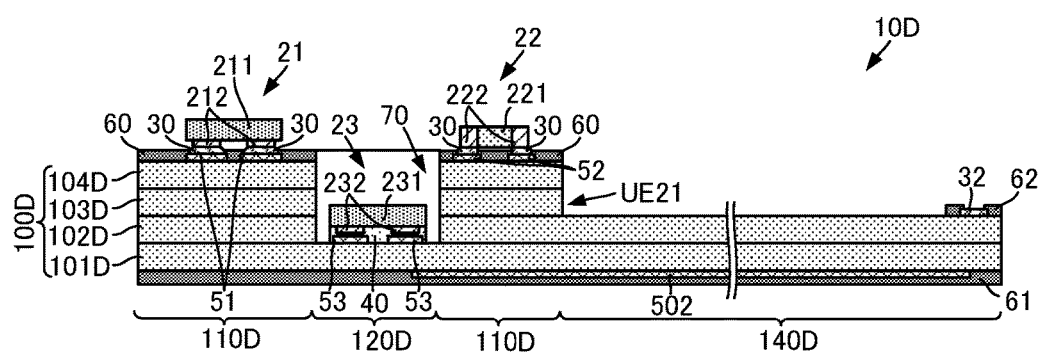
FIG. 8 is a side sectional view illustrating the structure of a component mounting board according to a fifth preferred embodiment of the present invention.

Next, a component mounting board according to a fifth preferred embodiment of the present invention will be described with reference to the drawings. FIG. 8 is a side sectional view illustrating the structure of a component mounting board 10D according to the fifth preferred embodiment of the present invention.

The component mounting board 10D according to the present preferred embodiment differs from the component mounting board 10C according to the fourth preferred embodiment in that a fourth portion 140D is additionally provided. Other structures of the component mounting board 10D are the same or substantially the same as those of the component mounting board 10C according to the fourth preferred embodiment, and description of the same or similar elements and features will be omitted.

An insulating board 100D is defined by a multilayer body including a plurality of insulating sheets 101D, 102D, 103D, and 104D. The first portion 110D includes the insulating sheets 101D, 102D, 103D, and 104D, and the second portion 120D includes only of the insulating sheet 101D. The fourth portion 140D includes the insulating sheets 101D and 102D. The fourth portion 140D is connected to the first portion 110D. The first portion 110D and the fourth portion 140D have different thicknesses, and accordingly, the insulating board 100D includes a step UE21.

The mounting structure of the electronic components 21 and 22 on the first portion 110D is the same or substantially the same as that on the first portion 110C according to the fourth preferred embodiment. The mounting structure of the electronic component 23 on the second portion 120D is the same or substantially the same as that on the second portion 120C according to the fourth preferred embodiment.

An external connection conductor 32 is provided on a surface of the fourth portion 140D at the side at which the step UE21 is provided. An insulating protection film 62 is also provided on this surface. The insulating protection film 62 includes a hole at which a portion (central portion) of the external connection conductor 32 is externally exposed. The exposed portion defines and functions as an external connection terminal to connect the component mounting board 10D to an external circuit board.

The external connection conductor 32 and the insulating protection film 62 are provided near an end portion of the fourth portion 140D that is opposite to an end portion connected to the first portion 110D (end portion adjacent to the step UE21). When the distance between the end portion of the fourth portion 140D adjacent to the step UE21 and the end portion of the fourth portion 140D near the external connection conductor 32 is greater than or equal to a predetermined length with respect to the height of the step UE21, the insulating protection film 62 is able to be easily provided in the region around the external connection conductor 32. In such a case, even when the step UE21 is provided, the insulating protection film 62 is able to be provided so that a hole at which a portion (central portion) of the external connection conductor 32 is externally exposed is accurately provided therein. Therefore, in such a case, the insulating protection film 62 is able to be used. The external connection conductor 32 may instead be joined using an anisotropic conductive film. In other words, the anisotropic conductive film or solder may be selected in accordance with, for example, the distance from the step UE21, the structure of the external circuit board to be connected, and the required level of joining reliability.

The structures of the above-described preferred embodiments may be combined as appropriate. In such a case, the above-described advantageous effects of the preferred embodiments may be obtained depending on the combination.

In each of the above-described preferred embodiments, the step is vertical to the first mounting surface and the second mounting surface. However, the step may instead be inclined in side view so that the first mounting surface and the second mounting surface are spaced apart from each other in plan view of the component mounting board. In such a case, when the second mounting surface is formed without changing the area of the first mounting surface, the area of the second mounting surface is smaller than that in the case in which the step is vertical. The anisotropic conductive film is more effective in such a case.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A component mounting board comprising: an insulating board; and a first electronic component and a second electronic component mounted on the insulating board; wherein the insulating board includes: a first portion that is relatively thick and a second portion that is relatively thin, the first portion and the second portion having different thicknesses so that a step is provided therebetween; a first land conductor provided on a first mounting surface of the first portion at a side at which the step is provided; a second land conductor provided on a second mounting surface of the second portion at the side at which the step is provided; and an insulating protection film provided on the first mounting surface so that a portion of the first land conductor is exposed and another portion of the first land conductor is covered by the insulating protection film; the first electronic component is soldered to the first land conductor; the second electronic component is joined to the second land conductor by an anisotropic conductive film that covers the second land conductor; and no insulating protection film that differs from the anisotropic conductive film is disposed on the second mounting surface, wherein the insulating board further includes a third portion that is thinner than the first portion; the component mounting board includes a third electronic component that is mounted on the third portion; and the third portion is thicker than the second portion.

2. The component mounting board according to claim 1, wherein the second portion is flexible.

3. The component mounting board according to claim 1, wherein the insulating board includes a plurality of insulating sheets that are laminated together in a thickness direction, and each of the plurality of insulating sheets is made of a thermoplastic resin.

4. The component mounting board according to claim 1, wherein the second portion is surrounded by the first portion.

5. The component mounting board according to claim 1, wherein an object is disposed in the first portion of the insulating board, and the object has a hardness greater than a hardness of the insulating board.

6. The component mounting board according to claim 3, wherein each of the plurality of insulating sheets includes a liquid crystal polymer as a main material.

7. The component mounting board according to claim 1, wherein another insulating protection film is provided on a surface of the insulating board at a side at which the step is not provided.

8. The component mounting board according to claim 1, wherein the insulating protection film is made of an epoxy-resin-based paste.

9. The component mounting board according to claim 1, wherein the second portion of insulating board includes a plurality of insulating sheets having the same or substantially the same area.

10. The component mounting board according to claim 1, wherein the first portion of the insulating board has an area that is smaller than an area of the second portion of the insulating board.

11. The component mounting board according to claim 1, wherein the insulating protection film includes at least one hole through which the first land conductor is exposed.

12. The component mounting board according to claim 11, wherein the insulating protection film extends over an entirety of or substantially an entirety of the first mounting surface, except for the at least one hole.

* * * * *